United States Patent
Dubey

(10) Patent No.: US 7,496,809 B2
(45) Date of Patent: Feb. 24, 2009

(54) INTEGRATED SCANNABLE INTERFACE FOR TESTING MEMORY

(75) Inventor: Prashant Dubey, Ghaziabad (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 378 days.

(21) Appl. No.: 11/423,393

(22) Filed: Jun. 9, 2006

(65) Prior Publication Data

US 2007/0011521 A1 Jan. 11, 2007

(30) Foreign Application Priority Data

Jun. 10, 2005 (IN) ........................ 1512/DEL/2005

(51) Int. Cl.
*G11C 29/00* (2006.01)

(52) U.S. Cl. .................. 714/718; 714/5; 714/42; 714/726; 714/727; 714/729; 714/735; 714/736; 714/742; 365/201

(58) Field of Classification Search ............ None
See application file for complete search history.

(56) References Cited

U.S. PATENT DOCUMENTS

| | | | |
|---|---|---|---|
| 5,115,191 A * | 5/1992 | Yoshimori | 714/724 |
| 5,175,447 A * | 12/1992 | Kawasaki et al. | 327/211 |
| 5,175,494 A * | 12/1992 | Yoshimori | 714/728 |
| 6,044,481 A | 3/2000 | Kornachuk et al. | |
| 6,275,963 B1 * | 8/2001 | Maeno et al. | 714/726 |
| 6,308,290 B1 * | 10/2001 | Forlenza et al. | 714/724 |
| 6,651,196 B1 * | 11/2003 | Iwase et al. | 714/724 |
| 7,145,818 B2 * | 12/2006 | Fukuoka et al. | 365/201 |
| 7,263,679 B2 * | 8/2007 | Kuge et al. | 716/10 |
| 7,315,971 B2 * | 1/2008 | Grose et al. | 714/718 |
| 2002/0194558 A1 * | 12/2002 | Wang et al. | 714/718 |

* cited by examiner

*Primary Examiner*—John P Trimmings
(74) *Attorney, Agent, or Firm*—Hogan & Hartson LLP

(57) ABSTRACT

An integrated scannable interface for testing memory. The interface includes a selection device for selecting a signal from at least two input signals responsive to an activation signal, a first storage device coupled to the output of the selection device for storing the signal responsive to a first enable signal and generating an output signal for the memory. The first storage device is connected at the input node of the memory, and a second storage device is coupled at its input to the first storage device for storing the output signal responsive to a second enable signal and generating a test signal for testing the memory. The output signal is observed for debugging faults between the integrated scannable interface and the memory and for debugging faults between the first and second storage devices.

7 Claims, 4 Drawing Sheets

INTEGRATED SCANNABLE INTERFACE FOR TESTING MEMORY

RELATED APPLICATION

The present application claims priority of India Patent Application No. 1512/Del/2005 filed Jun. 10, 2005, which is incorporated herein in its entirety by this reference.

FIELD OF THE INVENTION

The present invention relates to an integrated interface to test and debug failing memory on an integrated circuit.

BACKGROUND OF THE INVENTION

The increasing complexity on chip and of chip designs is inducing more defects in System on Chip (SoC) designs, and these defects are causing an increase in the testing requirements for each chip.

The yield of SOC and their designs is directly linked to the memories on the SOC because there are around 60 to 70 percent of the memories on the chip. Thus, the memory yield is directly converted to or related to the chip yield. A robust design and a very well controlled process can reduce the defect level in the memory, but, unfortunately in the newer technologies, as the gate lengths shrink, the defect level goes beyond the control of process and of the design as well.

Typically, the interfaces which are being used to test the memory in the current methodologies add a lot on the input of the memory as well because they do not penetrate much inside the memory hierarchy to increase the observability. As result, the conventional memory interface circuits are additional overheads to the memory. They add some extra timing overhead as well. Further, as these interfaces are not embedded inside the memory, it adds on to the cost of plugging it with the memory and increase the difficulty of measuring the timing defects between the system flip flops. It is therefore very difficult to predict whether the fault is in the memory or is at the interface.

U.S. Pat. No. 6,044,481 illustrates a conventional interface for testing memories. The interface includes a plurality of programmable input pins and output pins besides a logic interface or component used for connecting external signals to the plurality of programmable input and output pins. The external signals are processed by the logic interface and then communicated to a plurality of memory connection pins that couple to the memory device. This logic component is capable of being configured in accordance with one or more memory testing methodologies including a serial built-in-self-test (BIST), a parallel built-in-self-test (BIST), a parallel test, a serial test, and a scan test. The configuring is performed by interconnecting selected ones of the plurality of input pins and output pins to the external signals that drive the logic interface in a test mode that operates in one or more memory testing methodologies or a mission mode. The testing techniques disclosed by the aforementioned patent do not take into account area constraints for a typical SOC design.

Further, the conventional interfaces, which are being used to test the memory in the current methodologies, add a lot on the input of the memory, and they do not penetrate much inside the memory hierarchy to increase the observability. The memory interfaces, which have been proposed and are being used lack several desirable properties. For example, in case of a multiple memory structure in a chip, the interface may add on to the complexity by adding multiple test interface structure.

SUMMARY OF THE INVENTION

A need is therefore felt for a minimal area and high-speed integrated scan interface for testing memories that minimizes the timing faults of the testing system. In some embodiments, the present invention converts the latched interface into a flip-flop interface during test/scan mode. In some applications, the present invention is useful to measure the timing defects between the latches of the interface to thereby enhance the observation of the system for test and debugging. According to another aspect of the invention, high-speed patterns are captured at the input of the system so that speed binning is possible at the memory interface.

To this end, embodiments of the present invention provide an integrated, scannable interface for testing memory that includes a selection mechanism or component for selecting a signal from at least two input signals responsive to an activation signal. A first storage device or component is coupled to said selection component to store a signal responsive to a first enable signal and generating an output signal for the memory. The first storage device or component is connected at the input node of the memory, and a second storage device or component is coupled to said first storage device or component to store the output signal responsive to a second enable signal. This second storage device or component also acts to generate a test signal for testing the memory. In some cases, the output signal is observed for debugging faults between the integrated scannable interface and the memory and for debugging faults between said first and second storage devices or components (e.g., testing assemblies, circuits, or components useful for storing signals and performing the other functions described herein).

Further, the present invention provides a method for testing memory by using an integrated scannable interface. The method includes the steps of selecting a signal by a selector (e.g., a selection mechanism or component) from two input signals responsive to an activation signal, storing the signal in a first storage device or component responsive to a first enable signal, generating an output signal, observing the output signal for debugging faults between the integrated interface and memory, storing the output signal in a second storage device or circuit responsive to a second enable signal, producing a test signal from the second storage device for testing the memory, and observing the output signal for debugging faults between the first and second storage devices.

The present invention also provides a memory device having a plurality of storage cells for storing data, an address decoding device or decoder for receiving an address value and selecting cells from said plurality of storage cells corresponding to the address value, an input mechanism or device for storing data in the plurality of storage cells, an output mechanism or device that outputs data from the plurality of storage cells, a controller for enabling said address decoder, input device and output device, a high speed scan chain interface receiving enabling signals from the controller and coupled to the address decoder, input device and output device for providing high-speed and minimal area testing of the memory device.

It can be therefore seen that the overall gain is in terms of memory area, where half latch, which is already available at the memory interface, is used to make a scannable flip-flop. The same scannable flip-flop can be used in different configurations to test and debug the memory for the functional as well as timing failures, within the memory or at its interface.

BRIEF DESCRIPTION OF THE ACCOMPANYING DRAWINGS

The present invention will now be described with reference to the accompanying drawings.

DETAILED DESCRIPTION

The instant invention is directed generally to or targets a new high-speed interface for testing and debugging the embedded memories. This interface does not change the timing of the Inputs/Outputs or the memory and may be seamlessly integrated into the original memory Inputs/Outputs. One basic idea behind such an interface is first to use the latch on the memory input, and subsequently to convert the latch to a scan flip-flop.

Figure 1:
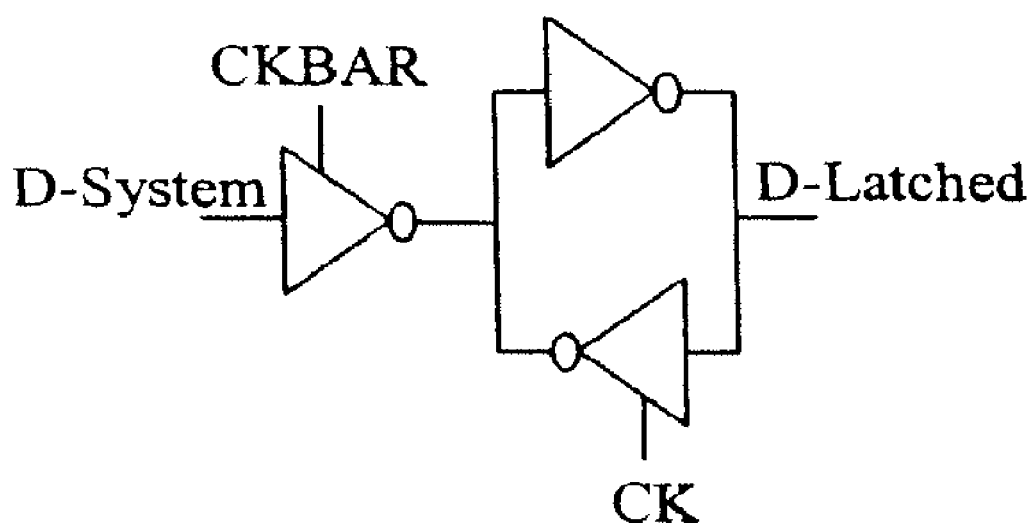
FIG. 1 illustrates a latch according to the instant invention.

FIG. 1 shows a schematic diagram of a latch in accordance with an embodiment of the present invention. As illustrated in the figure, the latch comprises a tri-state inverter connected to a test input signal, D-system. A test control signal, CKBAR, is applied to a tri-state inverter. The output of the tri-state inverter is fed to a pair of logical elements connected in a closed loop. The pair of logical elements includes a logic inverter and a tri-state inverter connected in series. The tri-state inverter receives a control signal, CK, which is the inversion of the signal CK. Eventually; the output, D-Latched, from the pair of logical elements is used for observing any timing faults in signal propagation between the latches.

Figure 2:
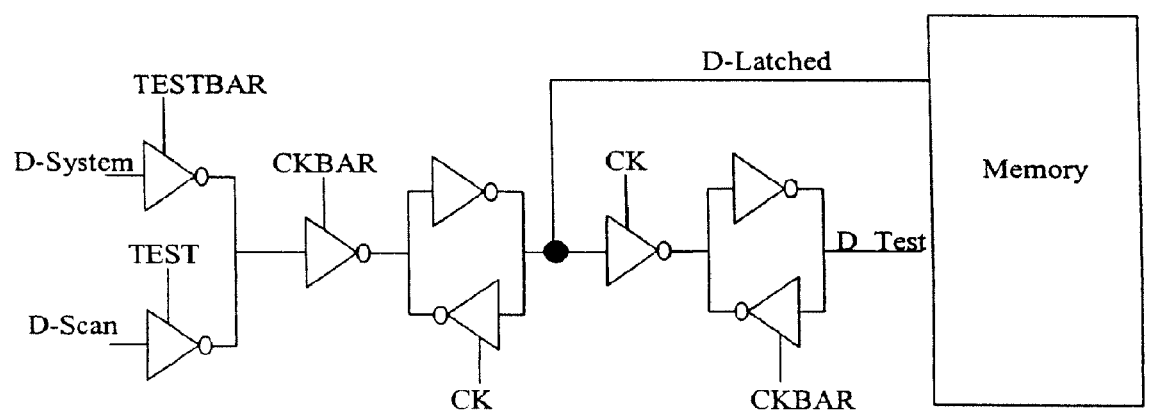
FIG. 2 illustrates a high-speed integrated interface for testing memory in accordance with the present invention.

FIG. 2 shows the conversion of a latch interface into a scannable flip-flop integrated interface. It includes a pair of tri-state inverters receiving test signals D-scan and D-system and receiving test control signals TEST and TESTBAR respectively. On applying the control signals, one of the D-scan or D-system input signals is selected and is applied to the input of a first latch, which has a structure similar to the latch illustrated in FIG. 1. The latch, which is a slave stage, is further coupled at its output to a second latch to form a scannable flip-flop interface. The test control signals applied to the second latch are CK and CKBAR, where CK is applied to the tri-state inverter and CKBAR is applied to the pair of logic elements. The output of the first latch, D-Latched is fed to the memory to detect any timing failure between the latches and to subsequently detect failures between flip-flops of the scan chain integrated interface.

It can be seen from FIG. 2 that all the latched inputs at the memory I/O level are first converted to the flip-flops by adding a slave stage, which is enabled through out the normal memory operation. Using the scan chain configuration, the value at the D-Latched outputs going to the memory can anytime be observed, thus providing a very good capability of debugging any fault on this interface. The observability at the D-System input also increases as the value at these inputs can be directly captured into these inputs as well as scanned out through the scan chain. Any timing faults at these inputs can also be captured by generating the transition fault detection patterns or path delay test patterns, e.g., using any Automatic Test Pattern Generation tool or the like. The clock that latches the Master Latch preferably is the same as the clock that latches the slave. Thus, a multiplexer is typically put in the memory clock path, which adds a hold in the memory but that can be compensated by the existing delay in the setup path of the memory.

Figure 3:
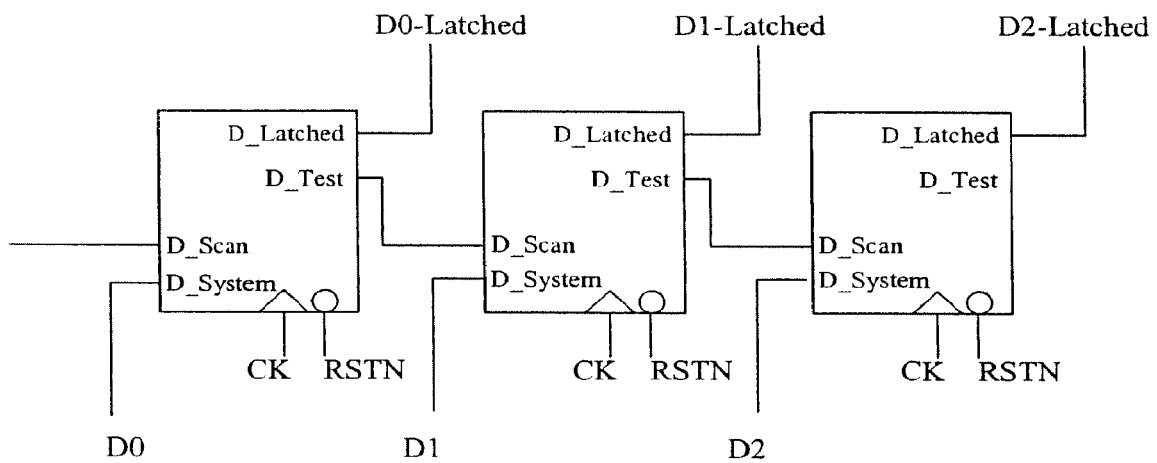
FIG. 3 illustrates a high-speed scan chain interface for testing memory according to an embodiment of the present invention.

FIG. 3 shows the formation of a scan chain by interconnecting a plurality of integrated interfaces. Referring to FIG. 3, it can be seen that the outputs D0-Latched, D1-Latched, D2-Latched are generated for debugging any timing faults in the scan chain that is significant in distinguishing between the fault in memory and the integrated interface. The inputs to the first scan flip-flop being D_Scan (D0) and D_System that generate D0-Latched and D_Test, where D_Test is further connected to the D_Scan input of the second scannable flip-flop. The other input to the second flip-flop is D1 at D_System that generates outputs D1_Latched and D_Test. Similarly, the outputs from the final flip-flop are D2-Latched and D_Test, where D_Test is finally applied for testing failing memory on SOC. The control signals applied to each flip-flop are the clock signal CK and a reset signal RSTN. It can be therefore seen that the path delay faults and the transition fault model can be used to detect timing related defects on the paths at these inputs.

By using the integrated scannable interface on the memory, the testing of memory becomes easier as the memory internal pins can be accessed through the scan chains formed using this interface. The scan chains formed are made by using the existing memory interface, which saves a lot of area and does not put extra impact on the setup—hold of the memory. When it comes to debugging, it helps to debug by generating a signal to detect whether the memory is failing due to setup-hold times or there is a hard failure in the memory. The interface can be used to capture high-speed input patterns at D-System, so that the speed binning is possible at the memory interface.

Thus, there is no extra timing impact on the memory timings as such. Furthermore, when the block is seamlessly integrated into the memory interface, the delays are much less. The same interface can be built up using pass gate multiplexers, and there can be other methodologies of building the logic. Using this Flip-Flop interface, a Pseudo-Random Pattern generation can be done. Even these flip-flops can also be used to latch the memory outputs, to make the output of the memory observable, or to provide a MISR (Multiple Input Signature Register) to compress memory data. There can be multipurpose usage of these flip-flops at the address inputs also. They also can be turned into Linear Feedback Shift Registers to generate Pseudo random pattern generators, as well as some incrementor or decrementors can be derived from the scannable flip-flops to actually write a known pattern on the memory to test it.

Figure 4:
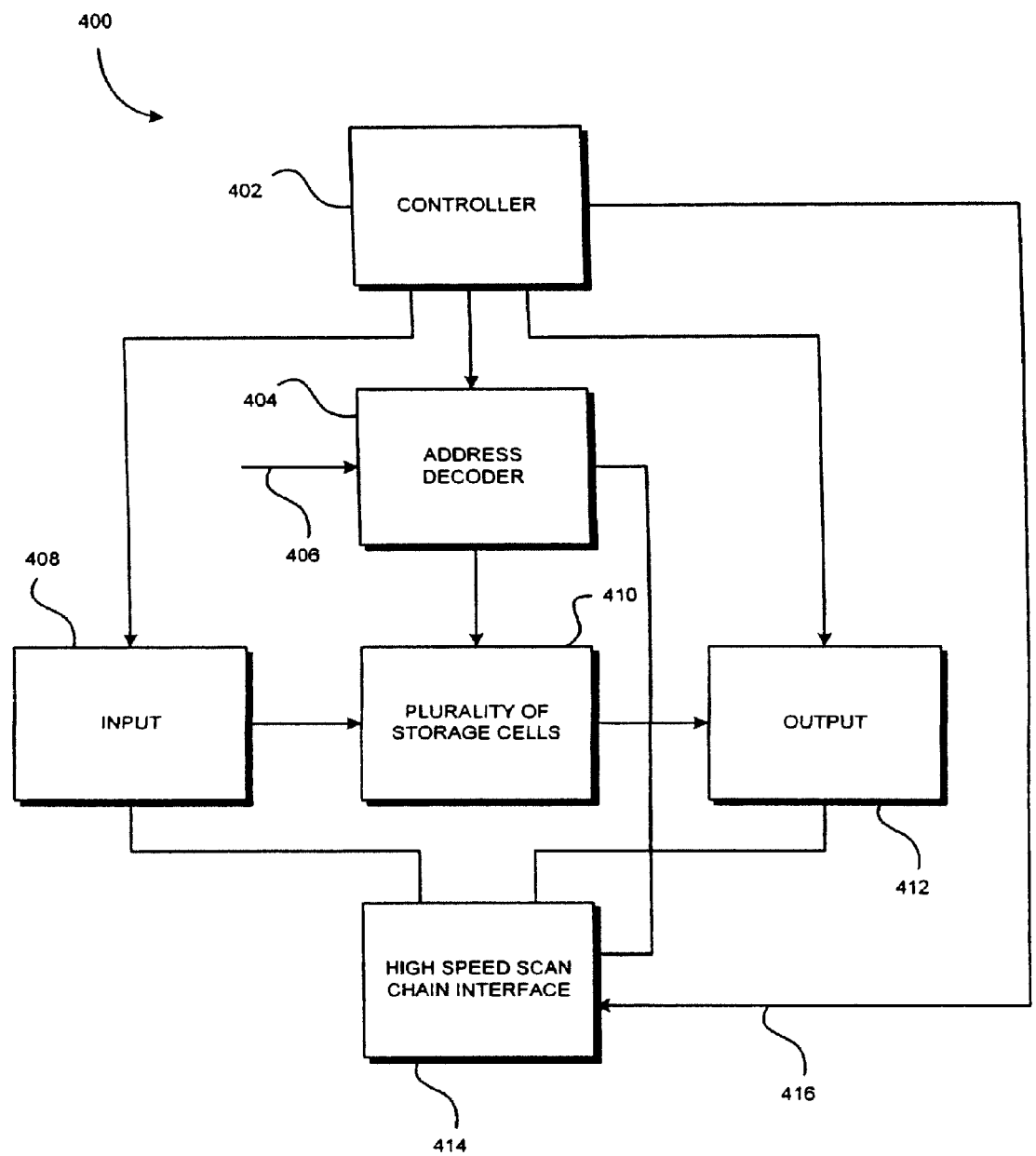
FIG. 4 illustrates a memory device according to an embodiment of the present invention.

Referring now to FIG. 4, a memory device 400 is shown, including a plurality of storage cells 410 for storing data; an address decoder 404 receiving an address value 406 and selecting cells from said plurality of storage cells 410 corresponding to said address value 406; an input device 408 storing data in said plurality of storage cells 410; an output device 412 that outputs data from said plurality of storage cells 410; a controller 402 enabling said address decoder 404, input device 408, and output device 412; and a high speed scan chain interface 414 receiving enabling signals 416 from said controller 402 and coupled to said address decoder 404, input device 408, and output device 412 providing high-speed, minimal area testing of the memory device. In the memory device 400 described above, the high speed scan chain interface 414 has, as previously described herein, at least two high-speed interfaces for testing memory, each high-speed interface including a selection component for selecting a signal from at least two input signals responsive to an activation signal; a first storage device coupled to said selection component storing said signal responsive to a first enable signal and generating an output signal for the memory, wherein said first storage device is operatively coupled at the input node of the memory; and a second storage device coupled to said first storage device storing said output signal responsive to a second enable signal and generating a test signal for testing the memory, wherein said output signal is observed for debugging faults between the high speed scan chain interface and the memory and for debugging faults between said first and second storage devices.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. An integrated scannable interface for testing memory, comprising:

means for selecting a signal from at least two input signals responsive to an activation signal;

first storage means coupled to said selection means for storing said signal responsive to a first enable signal and generating an output signal for the memory; said first storage means being connected at the input node of the memory; and second storage means coupled to said first storage means for storing said output signal responsive to a second enable signal and generating a test signal for testing the memory, wherein said output signal is used for debugging faults between the integrated scannable interface and the memory and for debugging faults between said first and second storage means.

2. The integrated scannable interface for testing memory as claimed in claim 1, wherein said selecting means comprises at least two tri-state inverters.

3. The integrated scannable interface for testing memory as claimed in claim 1, wherein said first storage means comprises a latch.

4. The integrated scannable interface for testing memory as claimed in claim 1, wherein said second storage means comprises a latch.

5. A method for testing memory by using an integrated scannable interface, said method comprising steps of:

selecting a signal with a selector from two input signals responsive to an activation signal;

storing said selected signal in a first device responsive to a first enable signal;

generating an output signal;

observing said output signal for debugging faults between the integrated interface and memory;

storing said output signal in a second device responsive to a second enable signal;

producing a test signal from said second device for testing the memory; and observing said output signal for debugging faults between said first and second devices.

6. A high-speed scan chain interface for testing memory having at least two high-speed interfaces, comprising:

a selection component selecting a signal from at least two input signals responsive to an activation signal;

a first storage device coupled to said selection component storing said signal responsive to a first enable signal and generating an output signal for the memory; said first storage device being connected at the input node of the memory; and a second storage device coupled to said first storage device storing said output signal responsive to a second enable signal and generating a test signal for testing the memory, wherein said output signal is observed for debugging faults between the high-speed chain interface and the memory and for debugging faults between said first and second storage devices.

7. A memory device, comprising:

a plurality of storage cells for storing data;

an address decoder receiving an address value and selecting cells from said plurality of storage cells corresponding to said address value;

an input device storing data in said plurality of storage cells;

an output device that outputs data from said plurality of storage cells;

a controller enabling said address decoder, input device, and output device; and a high speed scan chain interface receiving enabling signals from said controller and coupled to said address decoder, input device, and output device providing high-speed, minimal area testing of the memory device, wherein said high speed scan chain interface has at least two high-speed interfaces for testing memory, each high-speed interface comprising:

a selection component for selecting a signal from at least two input signals responsive to an activation signal;

a first storage device coupled to said selection component storing said signal responsive to a first enable signal and generating an output signal for the memory, wherein said first storage device is operatively coupled at the input node of the memory; and a second storage device coupled to said first storage device storing said output signal responsive to a second enable signal and generating a test signal for testing the memory, wherein said output signal is observed for debugging faults between the high-speed scan chain interface and the memory and for debugging faults between said first and second storage devices.

* * * * *